(12) United States Patent
Tee et al.

(10) Patent No.: US 9,659,843 B2
(45) Date of Patent: May 23, 2017

(54) LEAD FRAME STRIP WITH MOLDING COMPOUND CHANNELS

(71) Applicant: Infineon Technologies AG, Neubiberg (DE)

(72) Inventors: Boon Teik Tee, Taiping Perak (MY); Tiam Sen Ong, Semabok Melaka (MY)

(73) Assignee: Infineon Technologies AG, Neubiberg (DE)

( * ) Notice: Subject to any disclaimer, the term of this patent is extended or adjusted under 35 U.S.C. 154(b) by 48 days.

(21) Appl. No.: 14/533,463

(22) Filed: Nov. 5, 2014

(65) Prior Publication Data

US 2016/0126163 A1 May 5, 2016

(51) Int. Cl.
*H01L 23/495* (2006.01)
*H01L 21/56* (2006.01)
*H01L 21/78* (2006.01)
*H01L 23/00* (2006.01)
(Continued)

(52) U.S. Cl.
CPC ...... *H01L 23/49565* (2013.01); *H01L 21/565* (2013.01); *H01L 21/78* (2013.01); *H01L 23/49541* (2013.01); *H01L 23/49548* (2013.01); *H01L 24/97* (2013.01); *H01L 21/4842* (2013.01); *H01L 21/561* (2013.01); *H01L 23/3107* (2013.01)

(58) Field of Classification Search
CPC ............. H01L 21/4828; H01L 21/4842; H01L 23/49565; H01L 23/49541
See application file for complete search history.

(56) References Cited

U.S. PATENT DOCUMENTS 4,301,464 A * 11/1981 Otsuki ................ H01L 23/3107
257/670
4,862,586 A * 9/1989 Osada ............... B29C 45/14655
257/E21.504
(Continued)

FOREIGN PATENT DOCUMENTS

JP 06204384 A * 7/1994

OTHER PUBLICATIONS

Khoo, et al., "Lead Frame Strips with Electrical Isolation of Die Paddles", U.S. Appl. No. 14/015,148, filed Aug. 30, 2013.

*Primary Examiner* — William F Kraig
*Assistant Examiner* — Sun M King
(74) *Attorney, Agent, or Firm* — Murphy, Bilak & Homiller, PLLC (57) ABSTRACT

A lead frame strip has a plurality of unit lead frames. Each of the unit lead frames has a periphery structure connecting adjacent ones of the unit lead frames, a die paddle inside of the periphery structure, a plurality of leads connected to the periphery structure and extending towards the die paddle, and a molding compound channel in the periphery structure configured to guide liquefied molding material. The lead frame strip is processed by attaching a semiconductor die to each of the die paddles, electrically connecting each of the semiconductor dies to the leads, and forming a liquefied molding compound on each of the unit lead frames. The liquefied molding compound is formed such that the liquefied molding compound encapsulates the semiconductor dies and flows into the molding compound channels thereby forming molding extensions that extend onto the periphery structures.

9 Claims, 11 Drawing Sheets

(51) Int. Cl.
*H01L 21/48* (2006.01)
*H01L 23/31* (2006.01)

(56) References Cited

U.S. PATENT DOCUMENTS

| | | | |
|---|---|---|---|
| 5,623,163 A * | 4/1997 | Izumi | H01L 21/565 257/667 |
| 6,229,200 B1 | 5/2001 | Mclellan et al. | |
| 6,756,658 B1 | 6/2004 | Gillett et al. | |
| 7,008,825 B1 * | 3/2006 | Bancod | G01R 31/2896 257/666 |
| 7,091,602 B2 * | 8/2006 | Elliott | H01L 21/4842 257/625 |
| 7,479,409 B2 | 1/2009 | Camacho et al. | |
| 8,236,612 B2 | 8/2012 | San Antonio et al. | |
| 2006/0267162 A1 * | 11/2006 | Kunie | H01L 21/561 257/666 |
| 2008/0258278 A1 | 10/2008 | Ramos et al. | |
| 2008/0265923 A1 | 10/2008 | Kitnarong et al. | |
| 2014/0327004 A1 | 11/2014 | Baterna Marbella | |

\* cited by examiner

LEAD FRAME STRIP WITH MOLDING COMPOUND CHANNELS

TECHNICAL FIELD

The instant application relates to lead frame strips, and more particularly to physical supporting encapsulated semiconductor dies during processing of lead frame strips.

BACKGROUND

A lead frame forms the base or skeleton of an IC package, providing mechanical support to semiconductor dies during assembly into a finished package. A lead frame typically includes a die paddle for attaching a semiconductor die, and leads providing the means for external electrical connection to the die. The die can be connected to the leads by wires, e.g., through wire bonding or tape automated bonds. Lead frames are typically constructed from an electrically conductive material, such as copper or aluminum. The electrically conductive material may be provided in the form of a flat sheet metal. The features of the lead frames may be defined by forming openings in the flat sheet metal. The flat sheet metal can be patterned with a plurality of identically openings so as to form lead frame strips, i.e., interconnected strips used to package a number of semiconductor dies in a common process. Each lead frame strip includes a number of unit lead frames, with each unit lead frame having the die paddle and lead construction described above.

After completion of the assembly process, semiconductor dies attached to the die paddles are usually tested after separation of the unit lead frames from the lead frame strip, e.g., by punching. In other words, the semiconductor dies can be individually tested after singulation of the unit lead frames. Alternatively, the packaged semiconductor dies may be tested while still being physically supported by the lead frame strip using tie bars. This is commonly referred to as lead frame strip testing. In this technique, separation of the unit lead frames from the lead frame strip occurs after lead frame strip testing. However, the tie bars are formed from the same material as the die paddle, and are part of the unit lead frames. This is problematic for applications in which the die paddles serve an electrical connection function, e.g., in DSO (dual small outline) packages in which the exposed die paddles provide an electrical connection to the backside of semiconductor dies attached to the die paddles. In this case, the tie bars electrically short the die paddles to the lead frame strip and to other die paddles attached to the same lead frame strip, complicating the electrical testing process. Electrical isolation is also required for other lead frame processing such as partial plating and electrical charge processes.

SUMMARY

A method of processing a lead frame strip having a plurality of unit lead frames is disclosed. Each of the unit lead frames has a periphery structure connecting adjacent ones of the unit lead frames, a die paddle inside of the periphery structure, a plurality of leads connected to the periphery structure and extending towards the die paddle, and a molding compound channel in the periphery structure configured to guide liquefied molding material. According to an embodiment, the method includes attaching a semiconductor die to each of the die paddles, electrically connecting the semiconductor dies to the leads, and forming a liquefied molding compound on each of the unit lead frames. The liquefied molding compound is formed such that the liquefied molding compound encapsulates the semiconductor dies and flows into the molding compound channels thereby forming molding extensions that extend onto the periphery structures.

A method of forming a lead frame strip for packaging a plurality of semiconductor dies is disclosed. According to an embodiment, the method includes forming a plurality of connected unit lead frames, each of the unit lead frames including a periphery structure connecting adjacent unit lead frames in the lead frame strip, a die paddle inside of the periphery structure, and a plurality of leads connected to the periphery structure and extending towards the die paddle. The method further includes forming a molding compound channel in each of the periphery structures, each of the molding compound channels being configured to guide liquefied molding material so as to form molding extensions that extend onto the periphery structures.

A semiconductor device packaging assembly is disclosed. According to an embodiment, the semiconductor device packaging assembly includes a lead frame strip having a plurality of unit lead frames. Each of the unit lead frames include a periphery structure connected to adjacent ones of the unit lead frames, a die paddle inside of the periphery structure, a plurality of leads extending between the periphery structure and the die paddle, and a molding compound channel in the periphery structure. The molding compound channel is configured to guide liquefied molding material onto the periphery structure.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4, which includes FIGS. 4A and 4B, illustrates an enlarged view of the molding compound extending into the molding compound channels and forming molding extensions on the periphery structure, according to different embodiments.

FIG. 10, which includes FIG. 10A and FIG. 10B, illustrates a two-step process of forming the molding compound channels of FIG. 9, according to an embodiment.

DETAILED DESCRIPTION

Embodiments disclosed herein include a lead frame strip with a plurality of unit lead frames. Each unit lead frame includes a periphery structure (e.g., a ring-like structure) connecting adjacent ones of the unit lead frames, a die paddle inside of the periphery structure, and a plurality of leads connected to the periphery structure and extending towards the die paddle. Molding compound channels are formed in the periphery structure of each unit lead frame. According to an embodiment, the periphery structure of each unit lead frame includes tabs extending towards the lead frame, and the molding compound channels are formed along these tabs. The molding compound channels have a trench structure such that liquefied molding material is guided through the channels. During encapsulation of the semiconductor dies, liquefied molding material flows into the channels thereby forming molding extensions that extend onto the periphery structures. These molding extensions may have a finger like structure, for example.

Advantageously, the lead frame strip configuration and methods described herein provide a mechanism to physically support the die paddles and correspondingly attached semiconductor dies using the molding material. This allows for further processing steps (e.g., lead frame strip testing) to be performed after the lead trim and before singulation of the encapsulated semiconductor dies. According to an embodiment, the encapsulated semiconductor dies are only physically connected to the periphery structures by portions of the molding compound that include the molding extensions. That is, the die paddles are not connected to the periphery structures by a tie bar and there is no electrical connection between the die paddles and the periphery structures. Thus, strip-level testing of multiple encapsulated semiconductor dies can be performed, and this testing can be applied to each terminal of the semiconductor dies, including the terminal that is connected to the die paddles.

Figure 1:
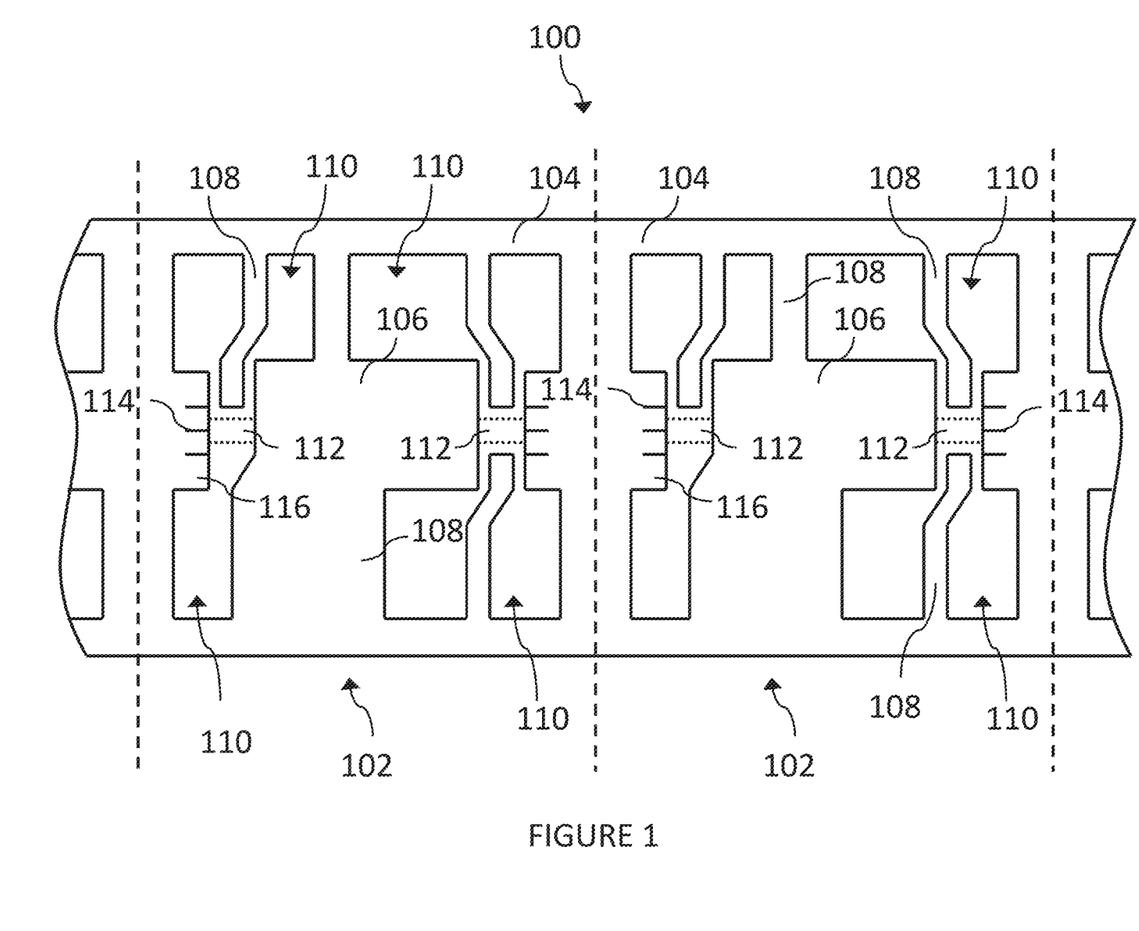
FIG. 1 illustrates a plan view of a lead frame strip with molding compound channels formed in the periphery structure of each unit lead frame in the lead frame strip, according to an embodiment.

Referring to FIG. 1, a plan view of a lead frame strip 100 is depicted, according to an embodiment. The lead frame strip 100 includes a plurality of unit lead frames 102, two of which are depicted in FIG. 1. Each of the unit lead frames 102 has a periphery structure 104 (e.g., a ring-like structure) connecting adjacent ones of the unit lead frames 102 together. Each of the unit lead frames 102 additionally includes a die paddle 106 inside of the periphery structure 104. In the event that the periphery structure 104 is formed as a closed loop, the die paddle 106 is completely surrounded by the periphery structure 104. The die paddle 106 may have a rectangular shape, for example. The unit lead frames 102 further include a plurality of leads 108 connected to the periphery structure 104 and extending towards the die paddle 106. Some of the leads 108 may be connected to the die paddle 106 as well.

The configuration of the unit lead frames 102 (e.g., the number and dimensions of the leads 108, size of the die paddle 106, etc.) may vary, depending upon the desired configuration of the finalized package design. Exemplary package designs include the SCT595 and SOT223 packages. The unit lead frames 102 may be formed along a single plane. Alternatively, the unit lead frames 102 may be formed along more than one plane. For example, the die paddle 106 may be vertically offset from the periphery structure 104.

The lead frame strip 100 may be formed by providing a sheet layer of electrically conductive material (e.g., copper, aluminum and the like) and by forming openings 110 in the sheet metal, e.g., by stamping or etching. According to an embodiment, the openings 110 are formed by photolithography. The geometry of the openings 110 defines the features of the unit lead frames 102, including the die paddle 106, the periphery structure 104, and the leads 108. A plurality of lead frame strips 100 may be formed from a single sheet, and the individual strips 100 may be singulated (i.e., separated) from this sheet.

According to an embodiment, each unit lead frame 102 includes one or more tie bars 112 connecting the die paddle 106 to the periphery structure 104. The tie bar 112 may be part of the sheet metal used to form the lead frame strip 100. Thus, the tie bar 112 provides a metallic connection between the die paddle 106 and the periphery structure 104 that is separate from the leads.

The tie bars 112 are represented by dashed lines because they are optional. According to an embodiment, the tie bars 112 are not included in the unit lead frames 102. In this embodiment, the leads 108 provide the only connection between the die paddles 106 and the adjacent periphery structure 104. According to the embodiment of FIG. 1, the die paddle 106 is physically connected (and supported) by two leads 108 on opposite sides of the die paddle 106. These leads 108 may form the power supply leads 108 in the packaged device, for example.

Each of the unit lead frames 102 includes a molding compound channel 114 in the periphery structure 104. According to an embodiment, the molding compound channels 114 are formed on a pair of opposite facing tabs 116 of the periphery structure 104 that extend towards the die paddles 106. The arrangement of the tabs 116 and/or molding compound channels 114 may vary.

Figure 2:
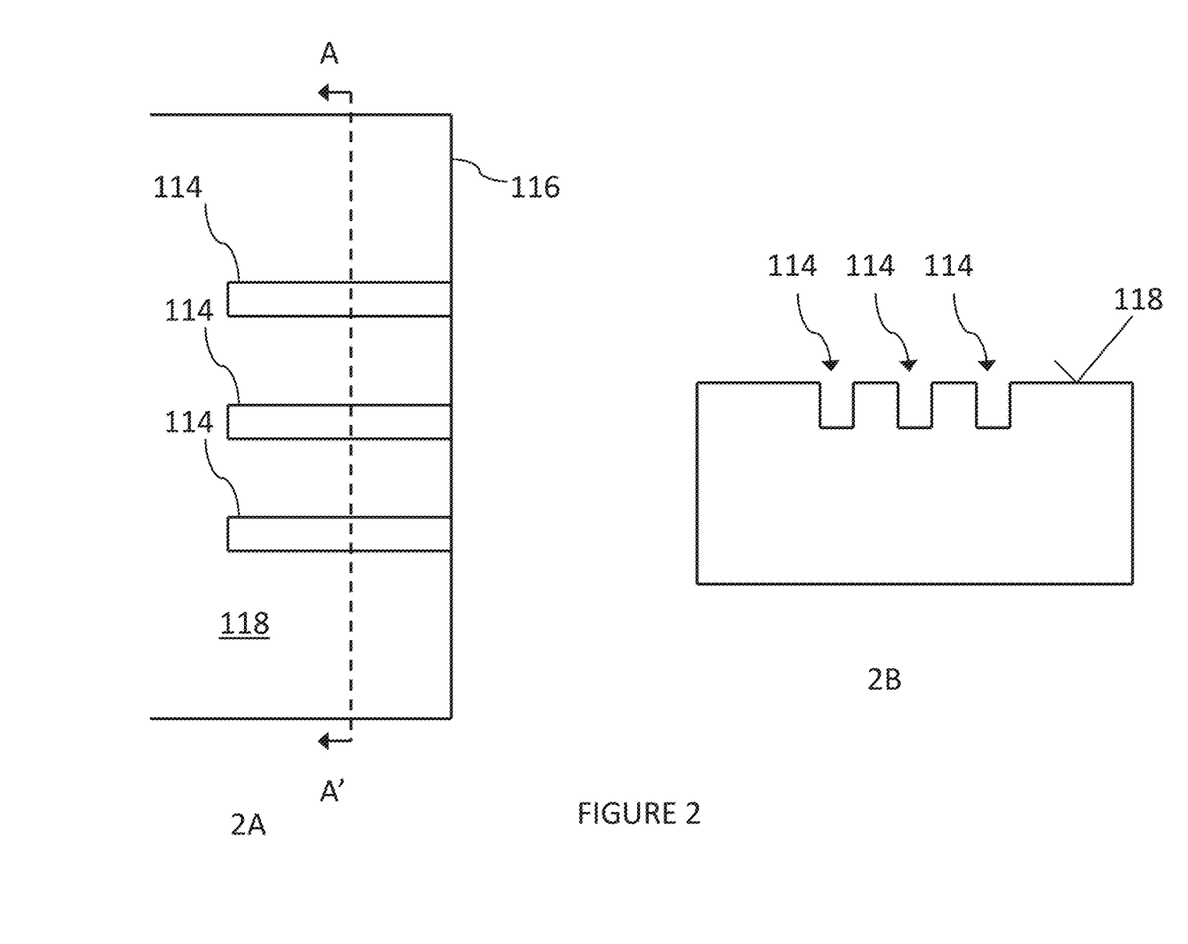
FIG. 2, which includes a plan view in FIG. 2A and a cross-sectional view in FIG. 2B, illustrates an enlarged view of the molding compound channels, according to an embodiment.

Referring to FIG. 2, an enlarged view of the tabs 116 having the molding compound channels 114 is depicted. FIG. 2A depicts a plan-view of the tabs 116 and molding compound channels 114 and FIG. 2B depicts a cross-sectional view of the tabs 116 and molding compound channels 114 along the line A-A' depicted in FIG. 2A. The molding compound channels 114 are configured to guide liquefied molding material. For example, the molding compound channels 114 may be formed as trenches or grooves extending from an outer surface 118 of the periphery structures 104 in each unit lead frame 102. These trenches or grooves are deep and wide enough such that liquefied molding material (e.g., a thermosetting plastic) will enter the molding compound channels 114 and will be guided sidewalls of the channels 114. Furthermore, the molding compound channels 114 increase the available surface area of the periphery structure 104 thereby improving adhesion between the molding material and the unit lead frames 102. The number, length and depth of the molding compound channels 114 may be adjusted according to these considerations. The molding compound channels 114 are intentionally formed into the unit lead frames 102, and are larger than naturally occurring impressions or indentations. Specific cross-sectional configurations of the molding compound channels 114, and techniques for forming the molding compound channels 114, will described in further detail with reference to FIGS. 6-10.

Figure 3:
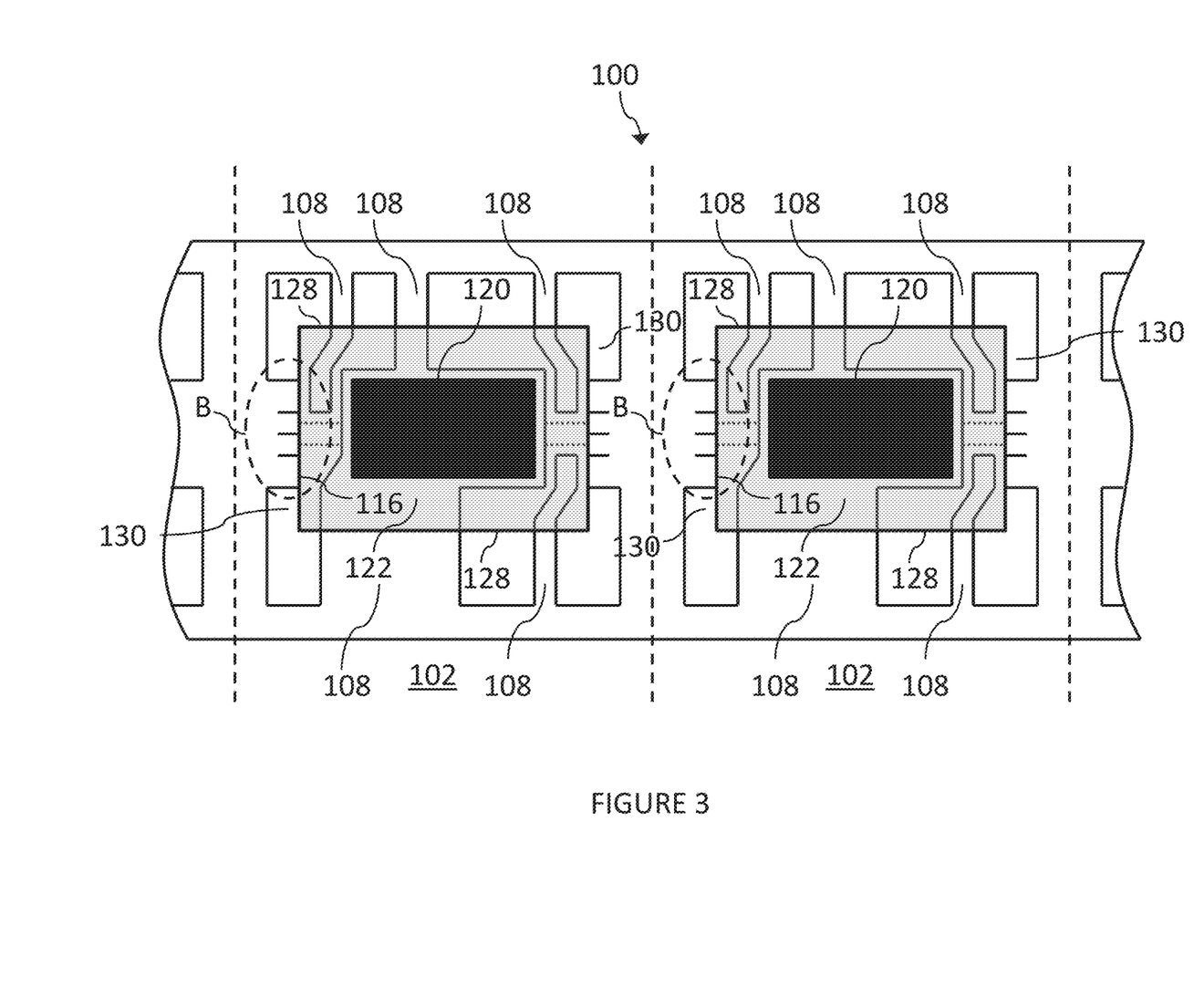
FIG. 3 illustrates a plan view of a lead frame strip with semiconductor dies affixed to the die paddles and a molding compound encapsulating the semiconductor dies, according to an embodiment.

Referring to FIG. 3, a method of processing the lead frame strip 100 is shown. According to the method, a semiconductor die 120 has been attached to the die paddles 106 in each of the unit lead frames 102. The semiconductor dies 120 may be attached by a solder material or adhesive, for example. After die attachment, the semiconductor dies 120 are electrically connected to the leads 108. For example, wire bonds or tape automated bonds may be provided between a top side of the semiconductor dies 120 and the leads 108. In the embodiment of FIG. 3, the lower sides of the semiconductor die 120 is electrically connected to two of the leads 108 via the die paddle 106 to provide a source connection.

The method further includes forming a liquefied molding compound 122 on each of the unit lead frames 102 such that the liquefied molding compound 122 encapsulates the semiconductor dies 120. This may be done using any of a number of known encapsulation techniques that utilize liquefied molding material. The molding compound 122 is an electrically insulating material, and may be a thermosetting epoxy resin or a thermoplastic, for example. According to an embodiment, encapsulation of the semiconductor dies 120 is done using a transfer molding process. In this technique, a mold cavity is placed on each unit lead frame 102 such that the die paddle 106 and the corresponding semiconductor die 122 attached to the die paddle 106 are arranged inside of the mold cavity. Thereafter, the liquefied molding compound 122 is transferred into the mold cavity (e.g., through a mold gate). The mold cavity adjoins the molding compound channels 114 so that the liquefied molding compound 122 may enter the mold cavity. According to an embodiment, the liquefied molding compound 122 enters the mold cavity and fills up the molding compound channels 114.

Figure 4:
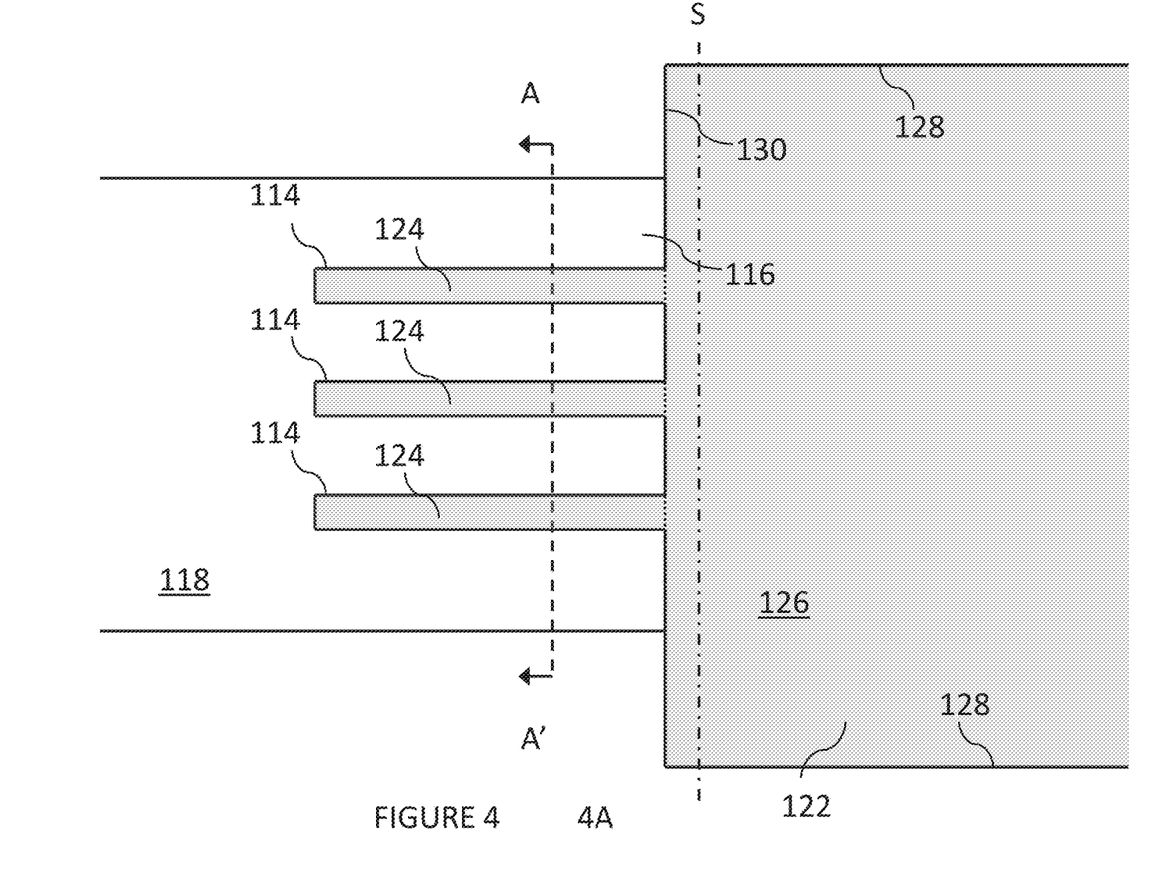

An enlarged view of the lead frame strip 100 in region "B" is depicted in FIG. 4. The molding process is performed such that the liquefied molding compound 122 flows into the molding compound channels 114 thereby forming molding extensions 124 that extend onto the periphery structures 104.

FIG. 4 provides a detailed view of the molding extensions 124. The molding extensions 124 correspond to portions of the molding compound 112 that are guided by the molding compound channels 114, and remain in the molding compound channels 114 after the molding process.

FIG. 4A depicts an embodiment in which the mold cavity is configured such that (within process tolerances) edges 130 of the molding compound 122 do not extend over the tabs 116. That is, the only portions of the molding compound 122 that are arranged on or extend over the unit lead frame 102 are the molding extensions 124.

FIG. 4B depicts an alternate embodiment in which the edges 130 molding compound 122 overlap with the tabs 116. That is, FIG. 4B depicts an overmold configuration. In this embodiment, the mold cavity may be placed over the tabs 116 of the periphery to form a rectangular portion of the molding compound 122 that is supported by the tabs 116.

After forming the liquefied molding compound 122 in the manner described above, the molding compound 122 is hardened. For example, if the molding compound 122 is a thermosetting epoxy resin or a thermoplastic, the lead frame strip 100 is cooled to cause the liquefied molding compound 122 to transition to a solid state or a partially solid state. As a result, the semiconductor dies 120 are encapsulated by an electrically insulating molding structure 126. Furthermore, the encapsulated semiconductor dies 120 are secured to the adjacent periphery structures 104 by sections of the hardened molding structure 126 including the molding extensions 124. That is, the die paddles 106 and correspondingly attached semiconductor dies 120 are physically coupled to the adjacent periphery structures 104 by sections of the hardened molding structure 126 that adhere to coupling points, i.e., the tabs 116 of the periphery structures 104 that include the molding compound channels 114. The presence of the molding compound channels 114 and the corresponding molding extensions 124 provides a high degree of adhesion between the hardened molding compound and the unit lead frame 102. Furthermore, the molding compound channels 114 and the corresponding molding extensions 124 provide an extended surface area to distribute the weight of the encapsulated semiconductor dies 120. As a result, a secure and reliable connection between hardened molding structure 126 and the unit lead frame 102 is formed.

According to an embodiment, the hardened molding structure 126 has a rectangular portion. That is, the molding structure 126 has first edge sides 128 that are parallel to one another and second edge sides 130 that are parallel to one another and perpendicular to the first edge sides 128. The leads 108 may be perpendicular to the first edge sides 128. The second edge sides 130 extend at least to the edge side of the tabs 116 that include the molding compound channels 114.

In the configuration of FIG. 4A, the molding extensions 124 provide the exclusive physical support mechanism between the unit lead frame 102 and the molding structure 126. In the overmold configuration of FIG. 4B, the overlap region provides further physical support (in addition to the physical support provided by the molding extensions 124) between the unit lead frame 102 and the molding structure 126. However, the tabs 116 are not necessarily part of the finalized package structure. When the encapsulated semiconductor dies 120 are eventually singulated to form individual packaged semiconductor devices, the molding structure 126 can be cut along a scribe line S that is spaced apart from the tabs 116, between the tabs 116 and the die paddle 106. In other words, the process can be controlled so that the molding structure is devoid of any metallic components at the edge sides corresponding to remnant portions of the tabs 116.

According to an embodiment, the molding extensions 124 are configured as fingers that extend away from the second edge sides 130 of the rectangular shaped portion of the molding structure. That is, a plurality of rectangular shaped molding extensions 124 that are parallel to one another extend outside of the rectangular shaped portion of the molding structure 126, perpendicular to the second edge sides 130.

Figure 5:
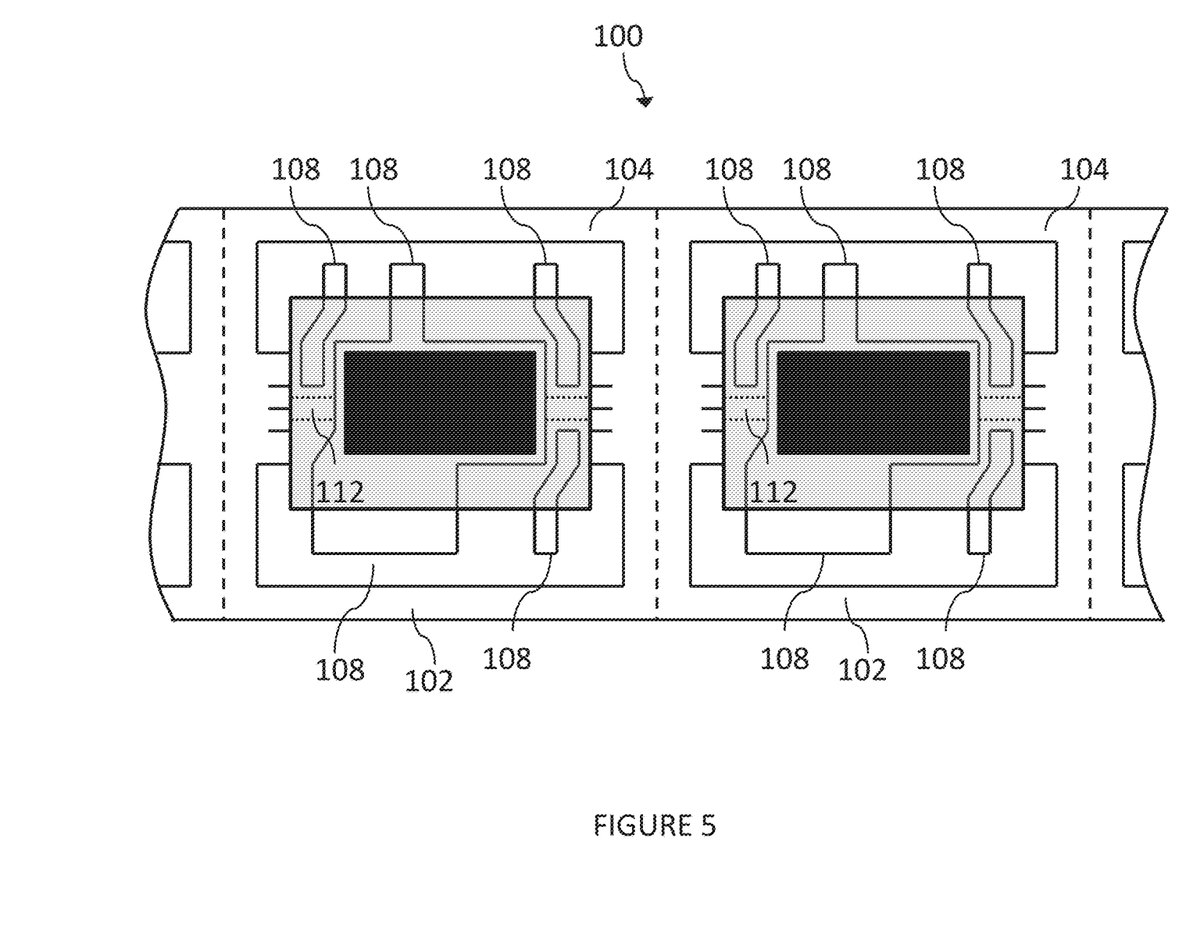
FIG. 5 illustrates the lead frame strip after trimming the leads, according to an embodiment.

Referring to FIG. 5, after hardening of the molding compound 122, the connections between the leads 108 and the periphery structures 104 in each of the unit lead frames 102 are severed. According to an embodiment, every continuous metallic connection between the die paddles 106 and the periphery structures 104 in each unit lead frame 102 is severed. In other words, there is no tie bar 112 or lead 108 physically coupling the die paddles 106 to the periphery structure 104. These connections may be severed by a lead trim process. If the unit lead frames 102 include the optional tie bar 112, this connection may be severed as well. As a result, the die paddle 106 and leads 108 are electrically disconnected from the periphery structure 104. Further, portions of the molding structure 126 including the molding extensions 124 provide the only physical support mechanism between the encapsulated semiconductor dies 120 and the periphery structures 104 in each unit lead frame 102. That is, the die paddle 106 is electrically insulated from the periphery structure 104, but remains physically supported by the periphery structure 104.

After severing the connections, further processing steps can be performed on the lead frame strip 100. These processing steps may include lead frame strip 100 testing, partial plating, and electrical charging, for example.

Advantageously, because the tie bar 112 can be eliminated, electrical access to each of the device terminals is possible, including any terminals connected to the die paddle 106, during these further processing steps. That is, the portions of the hardened molding structure 126 that include the molding extensions 124 provide the necessary physical support of the encapsulated semiconductor dies 120 such that a tie bar 112 is no longer needed to perform strip-level testing.

A further advantage of eliminating the tie bar 112 is that the finalized packaged device is less susceptible to corrosion and delamination. In a tie bar design, when the finalized package is singulated by cutting the molding structure along a splice line (e.g., in the manner described above), the finalized package includes a remnant of the tie bar extending from the die paddle to an edge side of the package. This creates a path for chemical corrosion between the exterior and the interior of the package and therefore increases the likelihood of failure. In addition, this path increases the possibility that the molding structure 126 will delaminate (i.e., separate). By contrast, the lead frame strip 100 design disclosed herein allows for the hardened molding structure 126 to be cut along the splice line S (shown in FIGS. 4A and 4B) between the tabs 116 and the die paddle 106 such that an edge side of the finalized package where the hardened molding structure 126 has been spliced is substantially devoid of metallic material (e.g., from the tie bar 112 or the tabs 116). In other words, the path for chemical corrosion described above can be eliminated. Further, this this can be done without forfeiting the benefits of lead frame strip testing.

According to an alternate embodiment, at least one continuous metallic connection between the die paddles 106 and the periphery structure 104 remains in each unit lead frame 102 after severing the connections between the leads 108 and the periphery structures 104. For example, each unit lead frame 102 may include one or more tie bars 112, and these tie bars 112 are not severed during the trimming of the leads 108. After severing the connections between the leads 108 and the periphery structures 104, the tie bar 112 forms the only continuous metallic connection between the die paddle 106 and the periphery structure 104 in each unit lead frame 102. In the alternative, one of the leads 108 may not be trimmed. In either case, the portions of the hardened molding structure 126 including the molding extensions 124 advantageously provide additional physical support and adhesion between the hardened molding structure 126 and the periphery structure 104 in the manner previously discussed.

FIGS. 6-9 depict possible cross-sectional geometries of the molding compound channels 114. FIGS. 6-9 each depict the unit lead frames 102 along the cross-sectional line A-A' shown in FIG. 4.

Figure 6:
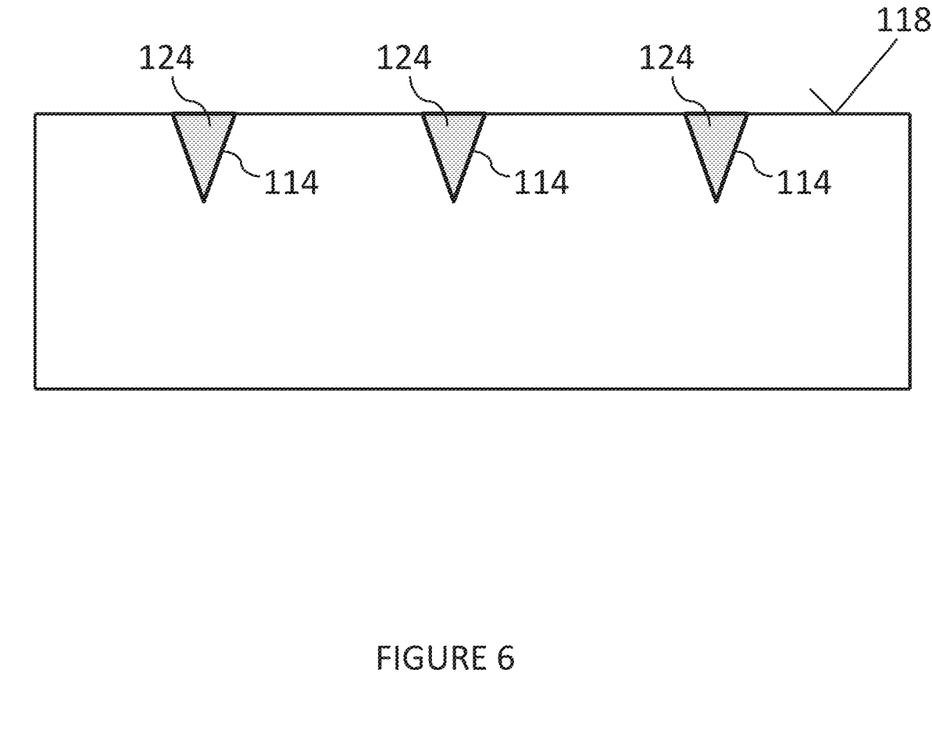
FIG. 6 illustrates a cross-sectional configuration of the molding compound channels, according to an embodiment.

As shown in FIG. 6, the molding compound channels 114 may have a v-shape cross-sectional geometry. As a result, the counterpart molding extensions 124 formed in the channels 114 act as teeth that engage with the unit lead frames 102.

Figure 7:
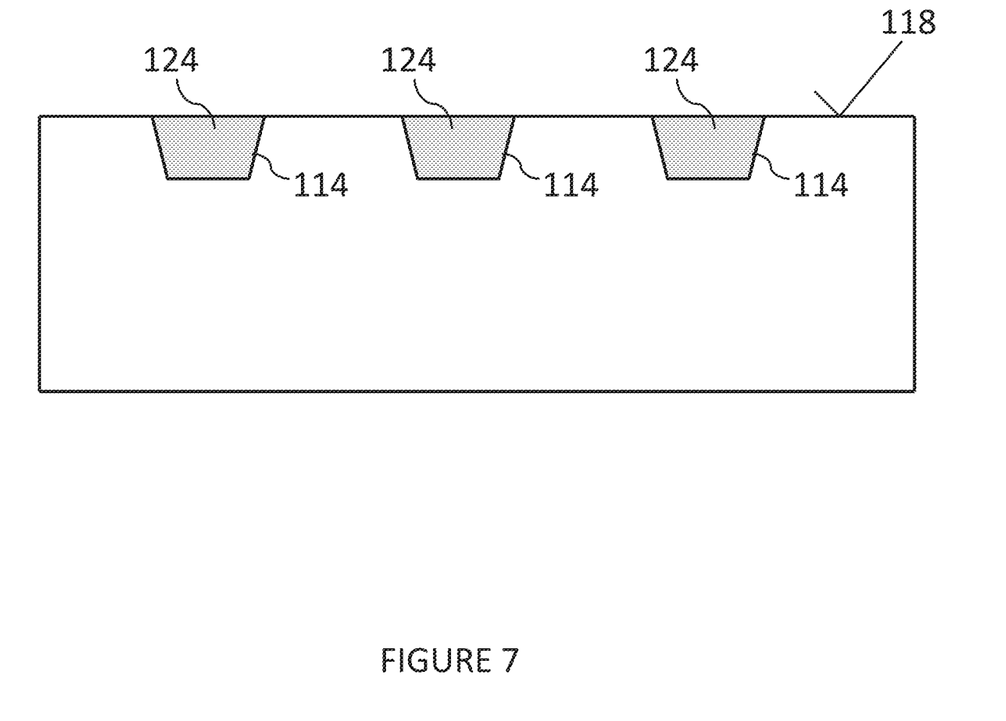
FIG. 7 illustrates a cross-sectional configuration of the molding compound channels, according to another embodiment.

As shown in FIG. 7, the molding compound channels 114 may have a u-shape cross-sectional geometry. That is, the molding compound channels 114 include linear sidewalls and a bottom section that forms an obtuse or perpendicular angle with the linear sidewalls.

Figure 8:
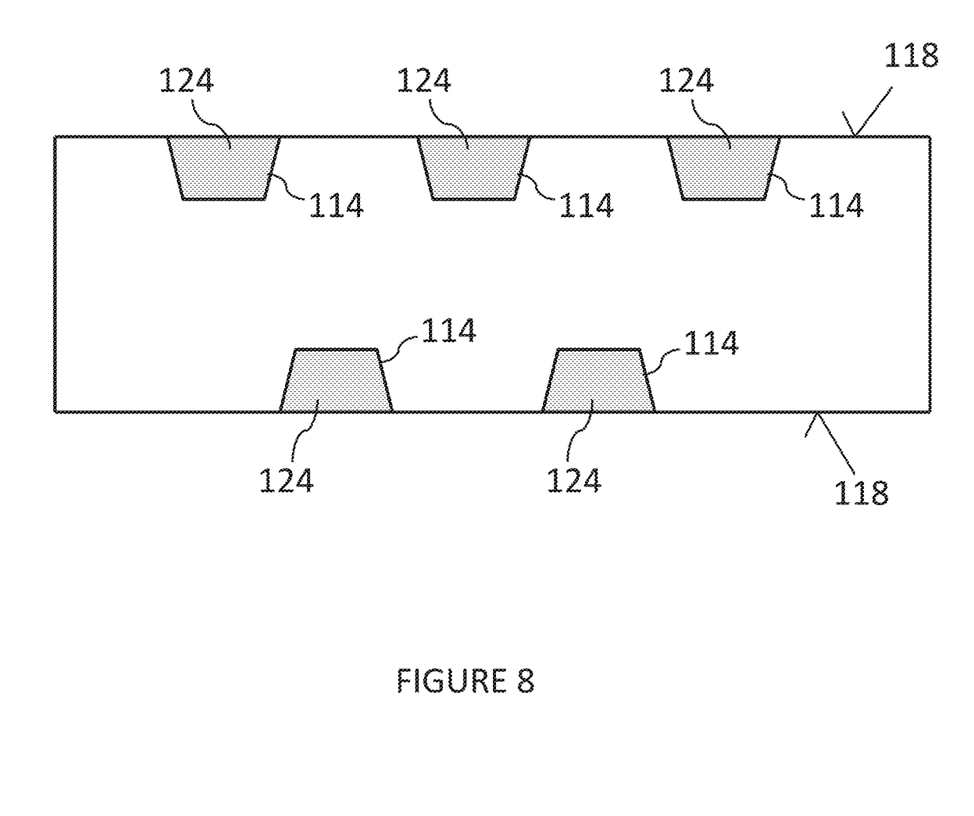
FIG. 8 illustrates a cross-sectional configuration of the molding compound channels, according to another embodiment.

FIG. 8 depicts an embodiment in which the molding compound channels 114 are formed on opposite facing surfaces 118 of the periphery structure 104 such that the molding extensions 124 extend over both of these opposite facing outer surfaces 118. This configuration provides additional adhesion between the hardened molding structure 126 and the unit lead frame 102. In addition, this configuration allows the lead frame strip 100 to be tilted while maintaining physical support of the encapsulated semiconductor dies 120. The u-shaped geometry for the molding extensions 124 is used as an example. However, alternate geometries are possible for the molding extensions 124, including the exemplary geometries disclosed herein.

Figure 9:
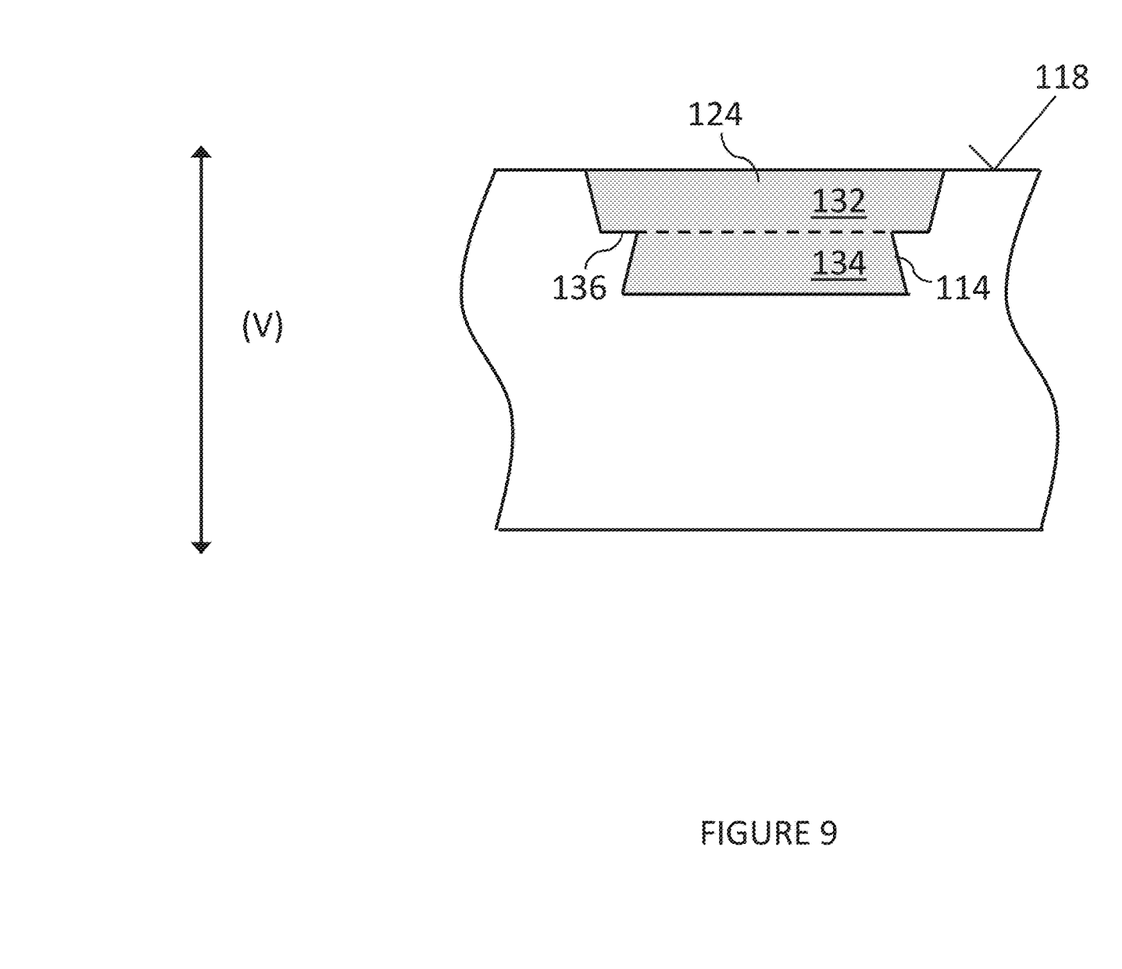
FIG. 9 illustrates a cross-sectional configuration of the molding compound channels, according to another embodiment.

FIG. 9 depicts and embodiment in which the molding compound channels 114 have two cross-sectional regions 132, 134. In a vertical direction (V) perpendicular to an outer surface 118 of the periphery structure 104, the molding compound channels 114 narrow in the first cross-sectional region 132. In the same vertical direction (V), the molding compound channels 114 widen in the second cross-sectional region 134. Consequently, the molding extensions 124 interlock with the corresponding molding compound channels 114. That is, the molding extensions 124 engage with the sidewalls of the molding compound channels 114 such that the sidewalls resist physical forces applied by the molding extensions 124 in the vertical direction (V). As a result, the adhesion and resistance to mechanical forces provided by the molding extensions 124 is increased. According to an embodiment, at a transition between the two cross-sectional regions 132, 134, a sidewall portion 136 of the molding compound channels 114 is substantially parallel to the outer surface 118.

The molding compound channels 114 may be formed by a punching process, for example. For example, after providing the sheet layer of electrically conductive material and forming openings 110 in the sheet metal that define the features of each unit lead frame 102, the outer surface 118 of the electrically conductive material may be punched in each unit lead frame 102. A pair of opposite facing molding compound channels 114 may be formed along opposite facing surfaces 118 (e.g., the molding compound channels 114 depicted in FIG. 8) by punching both of the opposite facing surfaces 118, either sequentially or simultaneously. As a result, pairs of opposite facing molding compound channels 114 that are spaced apart from one another by a thinned portion of the electrically conductive material that remains after the molding compound channels 114 are formed. As an alternative to punching, other techniques may be utilized to form the molding compound channels 114, e.g., etching, stamping, coining, etc.

Figure 10:
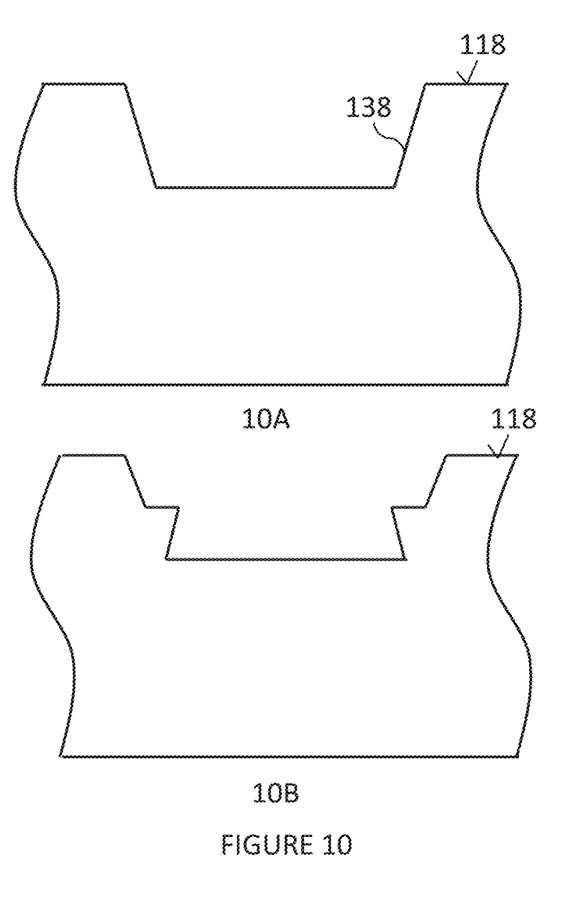

FIG. 10 depicts a two-step punch process that may be used to form the molding compound channels 114. This two-step punch process may be used to form the cross-sectional configuration of FIG. 9, for example. FIG. 10A depicts a first punching step of the process in which the outer surface 118 is punched to form channels with linear sidewalls 138 extending away from the outer surface 118 to a bottom of the channels. FIG. 10B depicts a second punching step in which the sidewalls 138 are modified so as to form angles between the outer surface 118 and the bottom of the channels. This may be done by performing a wider and shallower punch in the second punch step than in the first punch step. Subsequently, an interlocking molding extension 124 may be formed in the channel 114 in the manner previously discussed.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity, the term "substantially" encompasses any of these deviations. For example, "substantially parallel" surfaces may be deviate from one another by up to five degrees.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a lead frame strip having a plurality of unit lead frames, each of the unit lead frames having a periphery structure connecting adjacent ones of the unit lead frames, a die paddle inside of the periphery structure, a plurality of leads connected to the periphery structure and extending towards the die paddle, and a molding compound channel in the periphery structure configured to guide liquefied molding material, the method comprising:
   attaching a semiconductor die to each of the die paddles;
   electrically connecting the semiconductor dies to the leads; and
   forming a liquefied molding compound on each of the unit lead frames such that the liquefied molding compound encapsulates the semiconductor dies and flows into the molding compound channels thereby forming molding extensions that extend onto the periphery structures,
   wherein forming the liquefied molding compound comprises a transfer molding process in which the liquefied molding compound enters a mold cavity and fills the molding compound channels,
   wherein molding compound channels are formed in tabs of the periphery structure, the tabs extending towards the die paddle, and
   wherein the transfer molding process comprises providing the mold cavity over each of the unit lead frames such that the mold cavity directly adjoins molding compound channels.

2. The method of claim 1, further comprising:
   hardening the liquefied molding compound such that each of the encapsulated semiconductor dies are secured to the adjacent periphery structures by sections of the hardened molding compound including the molding extensions;
   severing the connections between the leads and the periphery structures in each of the unit lead frames after hardening the liquefied molding compound; and
   processing the lead frame strip after severing the connections.

3. The method of claim 2, wherein processing the lead frame strip comprises at least one of: lead frame strip testing, partial plating, and electrical charging.

4. The method of claim 1, further comprising severing every continuous metallic connection between the die paddles and the periphery structures in each unit lead frame such that the die paddles are electrically insulated from the periphery structures in each unit lead frame and such that the molding extensions form the only physical support mechanism between the encapsulated semiconductor dies and the periphery structures in each unit lead frame.

5. The method of claim 4, further comprising singulating the encapsulated semiconductor dies after the processing of the lead frame strip by cutting the hardened molding structure along a splice line between tabs of the structure and the die paddle such that an edge side of the molding structure corresponding to the splice line is substantially devoid of metallic material.

6. The method of claim 1, wherein the transfer molding process comprises providing the mold cavity over each of the unit lead frames such that the mold cavity extends over the tabs and the molding compound channels.

7. A method of forming a lead frame strip for packaging a plurality of semiconductor dies:
   forming a plurality of connected unit lead frames, each of the unit lead frames comprising a periphery structure connecting adjacent unit lead frames in the lead frame strip, a die paddle inside of the periphery structure, and a plurality of leads connected to the periphery structure and extending towards the die paddle; and
   forming a molding compound channel in each of the periphery structures, each of the molding compound channels being configured to guide liquefied molding material so as to form molding extensions that extend onto the periphery structures,
   wherein lead frame strip comprises providing a sheet layer of electrically conductive material and forming openings in the sheet metal that define the die paddle, periphery structure and the leads of each unit lead frame, and wherein forming the molding compound channel comprises punching the electrically conductive material at an outer surface of the periphery structures unit lead frame, and
   wherein a pair of opposite facing molding compound channels are formed along opposite facing surfaces of each unit lead frame, wherein the opposite facing molding compound channels of each pair are spaced apart from one another by a thinned portion of the electrically conductive material that remains after the molding compound channels are formed.

8. The method of claim 7, wherein forming the molding compound channel comprises a two-step punch process, wherein a first step of the punch process comprises punching the outer surface of the periphery structures to form cha with linear sidewalls extending away from the outer surface to a bottom of the channels, and wherein a second step of the punch process comprises performing a wider punch than the first step that modifies the sidewalls.

9. A method of processing a lead frame strip having a plurality of unit lead frames, each of the unit lead frames having a periphery structure connecting adjacent ones of the unit lead frames, a die paddle inside of the periphery structure, a plurality of leads connected to the periphery structure and extending towards the die paddle, and a molding compound channel in the periphery structure configured to guide liquefied molding material, the method comprising:
- attaching a semiconductor die to each of the die paddles;
- electrically connecting the semiconductor dies to the leads;
- forming a liquefied molding compound on each of the unit lead frames such that the liquefied molding compound encapsulates the semiconductor dies and flows into the molding compound channels thereby forming molding extensions that extend onto the periphery structures;
- hardening the liquefied molding compound such that each of the encapsulated semiconductor dies are secured to the adjacent periphery structures by sections of the hardened molding compound including the molding extensions;
- severing the connections between the leads and the periphery structures in each of the unit lead frames after hardening the liquefied molding compound; and
- processing the lead frame strip after severing the connections,
- wherein each of the unit lead frames comprise a tie bar connecting the die paddles to the periphery structures, and
- wherein, after severing the connections between the leads and the periphery structures, the tie bar forms the only continuous metallic connection between the die paddles and the periphery structure in each unit lead frame.

* * * * *

UNITED STATES PATENT AND TRADEMARK OFFICE
CERTIFICATE OF CORRECTION

PATENT NO. : 9,659,843 B2
APPLICATION NO. : 14/533463
DATED : May 23, 2017
INVENTOR(S) : Boon Teik Tee et al.

It is certified that error appears in the above-identified patent and that said Letters Patent is hereby corrected as shown below:

In the Claims

Column 10, Line 17 (Claim 5, Line 4), please change "the structure" to -- the periphery structure --.
Column 10, Line 39 (Claim 7, Line 14), please change "wherein lead" to -- wherein forming the lead --.
Column 10, Line 46 (Claim 7, Line 21), please change "unit" to -- in each unit --.
Column 10, Line 57 (Claim 8, Line 4), please change "cha" to -- channels --.

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*